United States Patent
Vinson et al.

(10) Patent No.: US 7,443,671 B2
(45) Date of Patent: *Oct. 28, 2008

(54) AXIAL DUCT COOLING FAN

(75) Inventors: Wade D. Vinson, Magnolia, TX (US);
John P. Franz, Houston, TX (US);
Ronald D. Noblett, Bellaire, TX (US);
Joseph R. Allen, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 401 days.

This patent is subject to a terminal disclaimer.

(21) Appl. No.: 11/263,662

(22) Filed: Oct. 31, 2005

(65) Prior Publication Data

US 2007/0097629 A1    May 3, 2007

(51) Int. Cl.
*H05K 7/20* (2006.01)
*H01L 23/36* (2006.01)
(52) U.S. Cl. .................. 361/695; 361/687; 361/697; 165/121; 165/122; 454/184; 415/220; 415/211.2; 415/214.1; 416/176; 416/177; 417/89; 417/423.14
(58) Field of Classification Search ......... 361/690–697, 361/703–705, 709–719; 165/80.2, 80.3, 165/104.33, 121, 122, 124; 454/16, 342, 454/344, 184; 415/208.2, 211.2, 176, 220, 415/221, 196, 204, 122.1, 124.2, 175, 177, 415/178, 214.1, 209.2, 209.3, 915; 416/176, 416/177, 198 R, 243, 201 A, 228; 310/64, 310/89, 90

See application file for complete search history.

(56) References Cited

U.S. PATENT DOCUMENTS

| | | | |
|---|---|---|---|
| 4,931,904 A | 6/1990 | Yiu | |
| 5,551,841 A * | 9/1996 | Kamada | 417/89 |
| 6,162,663 A | 12/2000 | Schoenstein et al. | |
| 6,210,134 B1 * | 4/2001 | Miyahara | 417/423.14 |
| 6,219,242 B1 | 4/2001 | Martinez | |
| 6,262,892 B1 * | 7/2001 | Bhatia | 361/695 |
| 6,538,888 B1 * | 3/2003 | Wei et al. | 361/697 |
| 6,565,892 B2 * | 5/2003 | Duvert | 424/605 |
| 6,570,760 B1 * | 5/2003 | Wang | 361/687 |
| 7,040,862 B2 * | 5/2006 | Otsuka | 415/214.1 |
| 7,056,204 B2 * | 6/2006 | Vinson et al. | 454/184 |
| 7,259,486 B2 * | 8/2007 | Yamamoto | 310/90 |
| 7,275,911 B2 * | 10/2007 | Lee et al. | 415/211.2 |
| 2004/0265126 A1 * | 12/2004 | Bielesch et al. | 415/220 |
| 2007/0097623 A1 * | 5/2007 | Vinson et al. | 361/687 |

* cited by examiner

Primary Examiner—Michael V Datskovskiy

(57) ABSTRACT

A cooling fan comprising a housing that connects to a chassis that is operable to support an electronic component. An axial duct runs through the housing. A blade assembly is rotatably disposed within the duct and comprises a plurality of fan blades that extend radially from a hub to a fan diameter. The axial duct has a chord length at least equal to the fan diameter. A motor assembly is disposed within the axial duct and coupled to said blade assembly. The cooling fan provides a cooling capacity of at least 1.5 air horsepower per cubic inch volume of the cooling fan.

21 Claims, 4 Drawing Sheets

AXIAL DUCT COOLING FAN

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined range (i.e., the device becomes too hot or too cold), the device may not function correctly, thereby potentially degrading the overall performance of the computer system. Thus, many computer systems include cooling systems to regulate the temperature of their electrical components. One type of cooling system is a forced air system that relies on one or more cooling fans to blow air over the electronic components in order to cool the components.

The cubic feet per minute ("CFM") of air that can be moved across an electric device is an important factor in how much heat can be removed from the device. Thus, the capacity of a cooling fan is a critical factor in selecting an air mover for use in a cooling application. The CFM that a cooling fan can produce is governed a number of factors including: the total area of the blades generating the airflow, the free area provided for airflow through the fan, the design of the blades, and the power generated by the electric motor.

Many axial fans used in forced air systems utilize a plurality of radial blades disposed within an annular housing, or shroud. These types of fans are commonly known as shrouded fans, muffin fans, or pancake fans. The axial depth of the housing is often just deep enough to contain the blade assembly and the motor, or motors, that power the fan. The CFM and pressure generated by a shrouded fan is generally dependent on the diameter of the blades. Therefore, as more performance is needed, the diameter of the fan increases. Thus, when utilized for cooling high density computer systems, the necessary diameter of a shrouded fan may preclude its use.

Electric ducted fans are commonly used in model airplanes to provide high thrust in small packages. Although providing relatively high flow rates and pressures, these fans are often not suitable for use in electronic cooling applications. Available electric ducted fans do not meet the longevity, reliability, power consumption, acoustic, and performance requirements of electronic cooling applications.

BRIEF SUMMARY

The problems noted above are solved in large part by a cooling fan comprising a housing that connects to a chassis that is operable to support an electronic component. An axial duct runs through the housing. A blade assembly is rotatably disposed within the duct and comprises a plurality of fan blades that extend radially from a hub to a fan diameter. The axial duct has a chord length at least equal to the fan diameter. A motor assembly is disposed within the axial duct and coupled to said blade assembly. The cooling fan provides a cooling capacity of at least 1.5 air horsepower per cubic inch volume of the cooling fan.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

A "ducted fan" is defined by the American Institute of Aeronautics and Astronautics ("AIAA") as an axial fan disposed within a duct having a chord length at least equal to the diameter of the fan. An "electric ducted fan" is a ducted fan powered by an electric motor providing power of at least 50 watts per cubic inch volume of the motor. A "shrouded fan" is defined as any axial fan disposed within an annular ring that has a chord length less than the diameter of the fan. "Chord length" as it is used herein, is defined as the straight-line distance along the longitudinal axis of a duct between the inlet and the outlet of the duct. "Cooling capacity" is the amount of air horsepower in watts per cubic inch volume of the fan producing the airflow, where the air horsepower is a function of the maximum value of the volumetric flow rate multiplied by the corresponding differential pressure at the corresponding point along the operating curve of the fan.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
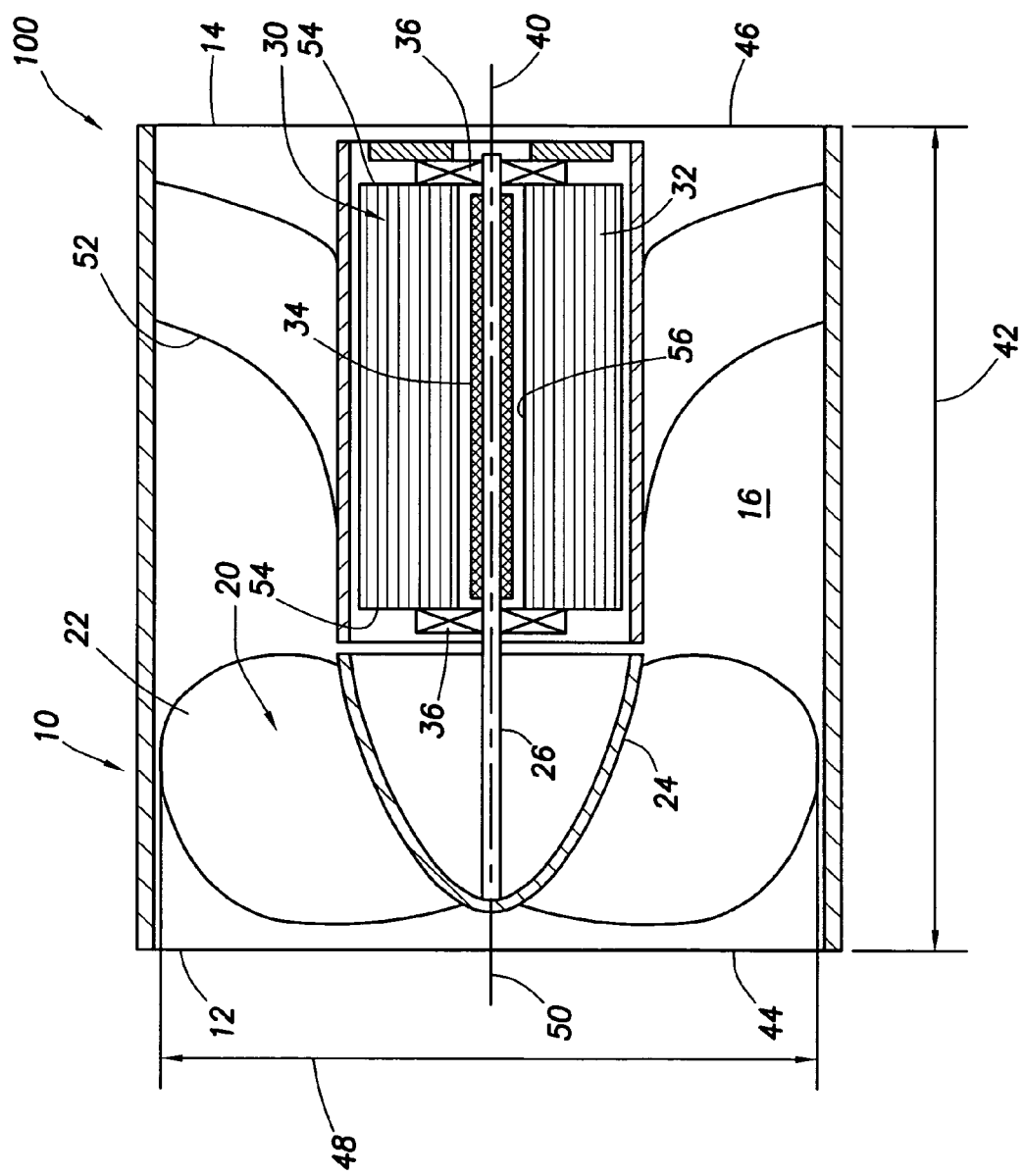
FIG. 1 shows a cooling fan constructed in accordance with embodiments of the invention.

Referring now to FIG. 1, cooling fan assembly 100 comprises housing 10, blade assembly 20, and motor 30. Housing 10 comprises front side 12, rear side 14, and axial duct 16. Blade assembly 20 comprises radial blades 22, hub 24, and axle 26. Motor 30 comprises windings section 32, magnet assembly 34, and bearings 36. Motor 30 may be a high density electric motor providing an output of at least 50 Watts per cubic inch of volume of the motor. Housing 10 includes features that allow fan assembly 100 to be coupled to a chassis that supports an electronic device.

Axial duct 16 has a longitudinal axis 40 and a chord length 42 that is defined as the distance between duct inlet 44 and duct outlet 46. Longitudinal axis 40 is perpendicular to both front side 12 and rear side 14. Radial blades 22 have a blade diameter 48. Fan assembly 100 is a ducted fan in that chord length 42 is at least equal to blade diameter 48.

Blade assembly 20 comprises radial blades 22 and hub 24 that include features that improve aerodynamic performance of fan assembly 100. Radial blades 22 and hub 24 rotate about a blade axis 50 that is aligned and coincident with longitudinal axis 40 of axial duct 16. For example, radial blades 22 have an aerodynamically optimized shape and are closely spaced so as to generate sufficient differential pressure across the blade assembly. Blades 22 have an outer blade diameter 48 that provides a small gap between the blade tips and the inside of duct 16. Hub 24 has a conical shape that helps smooth the flow of air into the blades.

Windings section 32 of motor 30 is disposed within duct 16 by struts 52. Bearings 36 are disposed outboard of either end 54 of windings section 32. Bearings 36 rotatably support axle 26 within bore 56 through windings section 32 and have an outer diameter that is larger than the diameter of bore 56. By disposing bearings 36 outboard of windings section 32, the amount heat that is transferred to the bearings from the windings is decreased. This reduces the temperature at which the bearing operates. The effective life of a bearing is partially dependent on the temperature at which the bearing operates and therefore, by decreasing the heat transferred to the bearings, bearing life can be increased.

Disposing the bearings outboard of the windings also increases the amount of space available for the windings by removing the bearings from the bore of the windings. The overall size of the windings section can be increased by decreasing the diameter of the bore. Increasing the size of the windings section increases the maximum power that can be generated by the cooling fan. Additional available power allows the fan to be operated at higher speeds, thus providing greater airflow and higher differential pressures.

Further, because the bearings are not constrained by the bore through the windings section, larger diameter bearings can be used. Larger diameter bearings may provide a longer service life than smaller bearings, may be less expensive to produce, and may permit the use of better lubricants and/or more lubricant volume. Bearings may be metal bearings, ceramic bearings, ball bearings, sleeve bearings, fluid dynamic bearings, or other type bearings that support rotation of the shaft. In certain embodiments, only one bearing may be used to support a shaft in a cantilevered manner.

Figure 2:
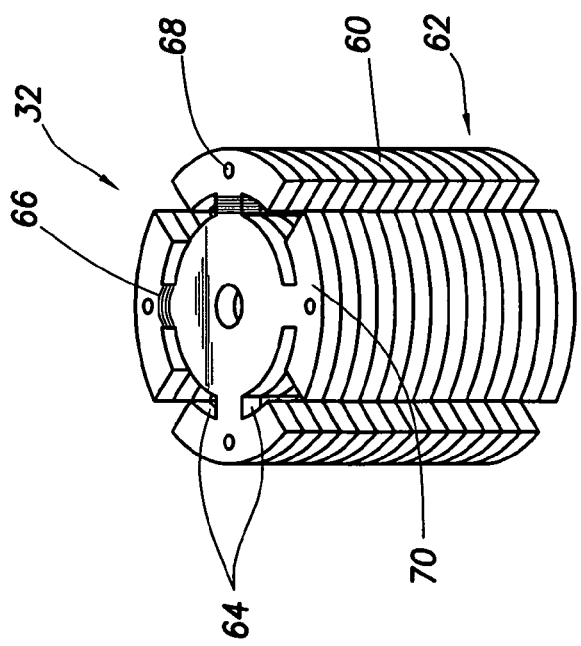
FIG. 2 shows a windings section constructed in accordance with embodiments of the invention.

Referring now to FIG. 2, windings section 32 comprises a plurality of thin metal plates 60 arranged in a stack 62. Stack 60 has a plurality of slots 64 through which a conducting wire 66 is wound. Because cooling fans for electronic components are often mass-produced in high quantities, windings section 32 has features that enable construction using mass production techniques. For example, the thickness of metal plates 60 may be between 0.005" and 0.020" so as to allow mass production. Metal plates 60 may be held together by stakes 68 driven through tabs 70. Stakes 68 provide easy assembly of the lamination stack 62 of windings section 32. Once the lamination stack 62 is formed, wire 66 must be wound through slots 64. Although efficiency of the motor increases as the number of slots increases, if the slots become too narrow, windings the wire may be difficult. Therefore, a number of slots is chosen such that windings section has the maximum number of slots that provide sufficient spacing for machine winding of wire. For example, if windings section has a diameter of 25 mm then it has 6 slots.

Figure 3:
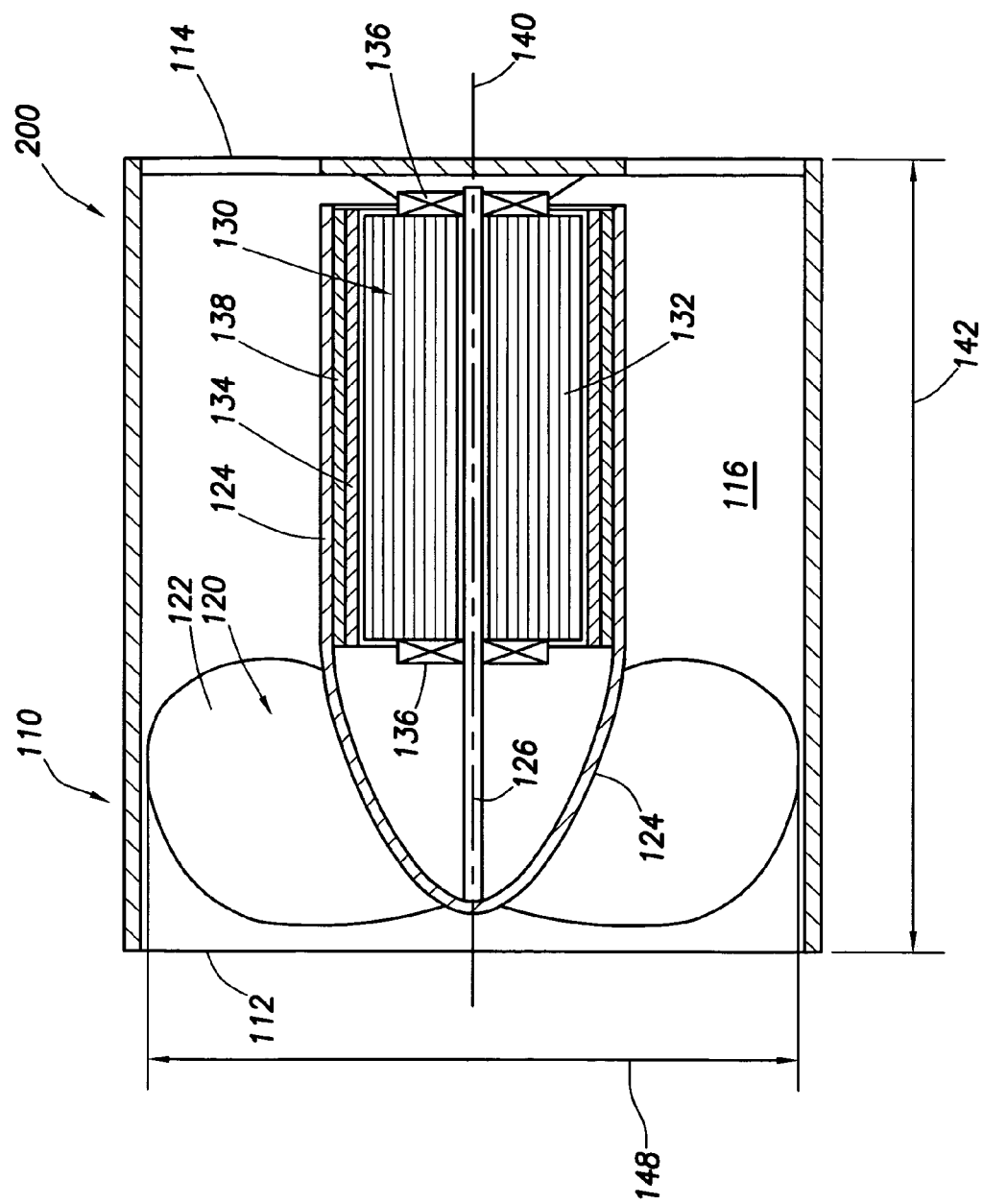
FIG. 3 shows a cooling fan constructed in accordance with embodiments of the invention.

Referring now to FIG. 3, fan assembly 200 comprises housing 110, blade assembly 120, and motor 130. Housing 110 comprises front side 112, rear side 114, and axial duct 116. Blade assembly 120 comprises radial blades 122, hub 124, and axle 126. Motor 130 comprises windings section 132, magnet assembly 134, and bearings 136. Housing 110 includes features that allow fan assembly 200 to be coupled to a chassis that supports an electronic device.

Axial duct 116 has a longitudinal axis 140 and a chord length 142 that is defined as the distance between duct inlet 144 and duct outlet 146. Longitudinal axis 140 is perpendicular to both front side 112 and rear side 114. Radial blades 122 have a blade diameter 148 and rotate about a blade axis 150 that is aligned and coincident with longitudinal axis 140 of axial duct 116. Fan assembly 200 is a ducted fan in that chord length 142 is at least equal to blade diameter 148.

Motor 130 is an outer rotor motor where magnet assembly 134 is disposed within hub 124 of blade assembly 120. Magnet assembly 134 may be constructed from a single-piece ring magnet or may be assembled from a plurality of smaller magnets. Magnet assembly 134 may be constructed from a neodymium-iron boron material so as to provide high magnetic efficiency while retaining high volume capability. Blade assembly 120 also comprises a back iron cup 138 disposed between magnet assembly 134 and hub 124.

Figure 4:
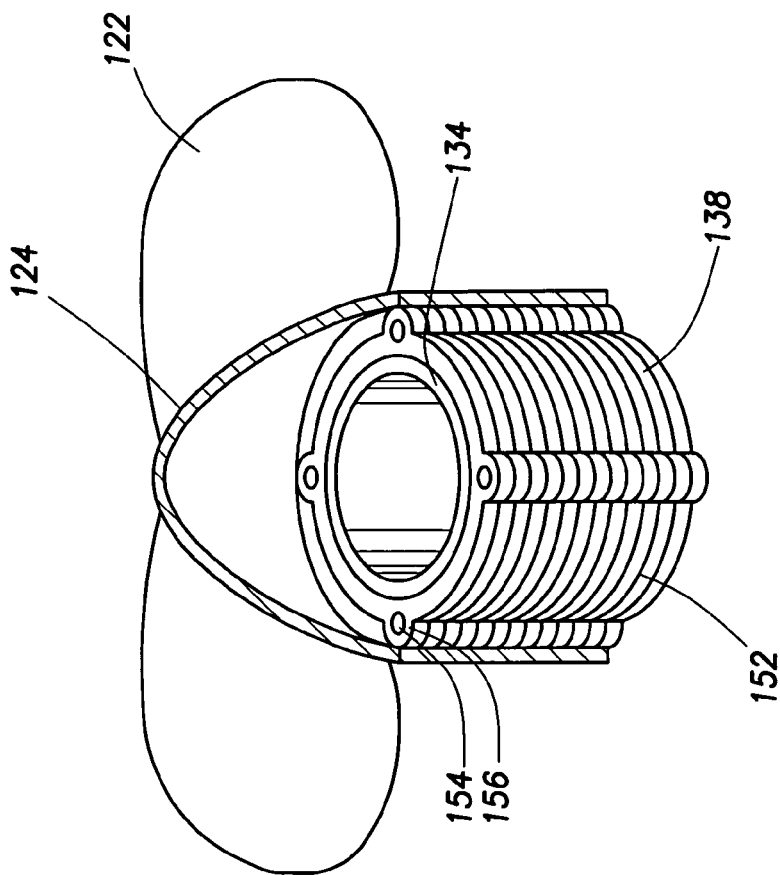
FIG. 4 shows a blade assembly constructed in accordance with embodiments of the invention.

Referring now to FIG. 4, back iron cup 138 comprises a plurality of laminated rings 152 held together by stakes 154 through staking tabs 156. Hub 124, including radial blades 122, may be directly overmolded onto back iron cup 138. Providing a back iron cup 138 constructed from laminated rings reduces eddy current losses found when solid back iron cups are used. Stakes 154 and staking tabs 156 enable high volume manufacturing techniques to be used. Hub 124 can be overmolded onto back iron cup 138 so as to minimize reduction in blade area.

By incorporating one or more of the above described features, an electric ducted fan for use in an electronics cooling application could provide a cooling capacity of at least 1.5 air horsepower per cubic inch of fan volume (hpa/in$^3$). Utilizing the features described herein, a fan sized for use in a 2U server can provide a cooling capacity of approximately 5 air horsepower per cubic inch of fan volume. This compares to conventional "muffin" or "pancake" fans of comparable diameter that are limited to less than 1 air horsepower per cubic inch of fan volume. As can be seen the combination of the ducted fan having an improved performance results in increased cooling capacity that provides a forced air cooling solution with high flow rates and pressures.

Figure 5:
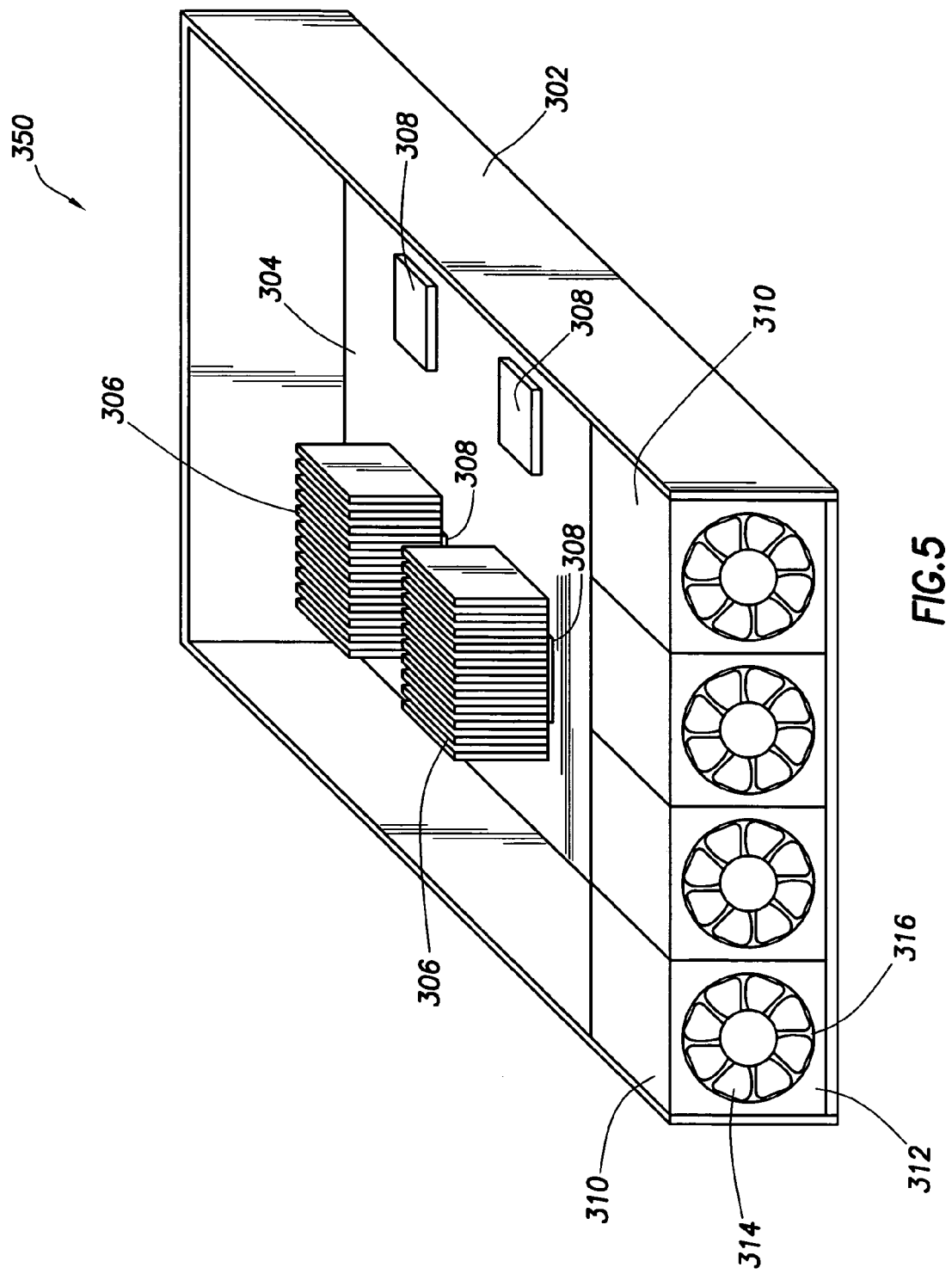
FIG. 5 shows a computer assembly including cooling fans constructed in accordance with embodiments of the invention.

Referring now to FIG. 5, a computer assembly 350 comprises chassis 302, motherboard 304, heat sinks 306, electronic components 308, and cooling fans 310. Each cooling fan 310 comprises a housing 312 surrounding a blade assembly 314 disposed within a duct 316 that has chord length at least equal to the diameter of the blade assembly. Cooling fans 310 are arranged so as to generate an airflow that cools electronic component 308. Heat sinks 306 may be arranged so as to be directly in the airflow generated by fans 310. Heat sinks 306 are coupled to electronic components so that the heat generated by the electronic component is dissipated to the airflow through the increased surface area of the heat sink.

The above discussion is meant to be illustrative of the principles and various embodiments of the present invention.

Numerous variations and modifications will become apparent to those skilled in the art once the above disclosure is fully appreciated. For example, the motor improvements described herein can be utilized in other types of electric motors and cooling fan assemblies. It is intended that the following claims be interpreted to embrace all such variations and modifications.

What is claimed is:

1. A cooling fan comprising:
   a housing that connects to a chassis that is operable to support an electronic component;
   an axial duct through said housing;
   a blade assembly rotatably disposed within said duct, wherein said blade assembly comprises a plurality of fan blades that extend radially from a hub to a fan diameter, wherein said axial duct has a chord length at least equal to the fan diameter; and
   a motor assembly disposed within said axial duct and coupled to said blade assembly, wherein said motor assembly comprises:
      a windings section coupled to said housing;
      an axle coupled to said blade assembly and disposed partially within a bore through said windings section; and
      a bearing assembly that rotatably couples said axle to said windings section, wherein said bearing assembly is disposed outboard of said windings section;
   wherein the cooling fan provides a cooling capacity of at least 1.5 air horsepower per cubic inch volume of the cooling fan.

2. The cooling fan of claim 1 wherein said housing comprises a first side and a parallel second side, wherein said axial duct has a longitudinal axis that is perpendicular to the first and second sides of said housing.

3. The cooling fan of claim 2 wherein said blade assembly has a blade axis that is aligned with the longitudinal axis of said axial duct.

4. The cooling fan of claim 1 wherein said motor assembly further comprises:
   a magnet assembly coupled to said blade assembly.

5. The cooling fan of claim 1 wherein said bearing assembly has an outer diameter larger than the bore through said windings section.

6. The cooling fan of claim 1 wherein said bearing assembly is preloaded.

7. The cooling fan of claim 4 wherein said windings section comprises a plurality of laminations having a thickness of less than 0.020".

8. The cooling fan of claim 4 wherein said magnet assembly comprises a magnet coupled to an axle that is attached to said blade assembly and disposed partially within a bore through said windings section.

9. The cooling fan of claim 4 wherein said magnet assembly comprises a magnet disposed on an inner surface of the hub so that the magnet is proximate to an outer surface of the windings section.

10. The cooling fan of claim 9 wherein said magnet assembly is disposed between the windings section and a back iron cup disposed on the hub, wherein the back iron cup comprises a plurality of laminations.

11. The cooling fan of claim 10 wherein the hub is overmolded onto the back iron cup.

12. The cooling fan of claim 4 wherein said magnet assembly comprises a ring magnet.

13. A computer system comprising:
   a chassis;
   an electronic component supported by said chassis; and
   a electric ducted fan coupled to said chassis, said electric ducted fan comprising:
      a blade assembly;
      a motor assembly coupled to the blade assembly, wherein the motor assembly comprises a windings section;
      an axle coupled to the blade assembly and disposed partially within a bore through the windings section; and
      a bearing assembly that rotatably couples said axle to the windings section, wherein the bearing assembly is disposed outboard of the windings section;
   wherein said electric ducted fan provides a cooling capacity of at least 1.5 air horsepower per cubic inch volume of the cooling fan.

14. The computer system of claim 13 wherein said ducted fan further comprises:
   a housing comprising a first side and an opposed second side;
   an axial duct through said housing, wherein the axial duct intersects the first and second sides; and
   a magnet assembly disposed within the motor assembly;
   wherein the motor assembly is disposed within said axial duct; and
   wherein said blade assembly comprises a plurality of fan blades that extend radially from a hub to a fan diameter, wherein said axial duct has a chord length at least equal to the fan diameter.

15. The computer system of claim 14 wherein said axial duct has a longitudinal axis that is perpendicular to the first and second sides of said housing and wherein said blade assembly rotates about a blade axis that is aligned with the longitudinal axis of said axial duct.

16. The computer system of claim 14 wherein said bearing assembly has an outer diameter larger than the bore through said windings section.

17. The computer system of claim 14 wherein said bearing assembly is preloaded.

18. The computer system of claim 14 wherein the windings section comprises a plurality of laminations having a thickness of less than 0.020".

19. The computer system of claim 14 wherein the magnet assembly is disposed on an inner surface of the hub, wherein the motor assembly further comprises a back iron cup disposed between the magnet assembly and the hub.

20. The computer system of claim 19 wherein the back iron cup comprises a plurality of laminations and the hub is overmolded onto the back iron cup.

21. The computer system of claim 14 wherein said magnet assembly comprises a ring magnet.

* * * * *